(12) United States Patent
Suthram et al.

(10) Patent No.: US 12,438,080 B2
(45) Date of Patent: Oct. 7, 2025

(54) AND PROCESS FOR A PRECISION RESISTOR

(71) Applicant: Intel Corporation, Santa Clara, CA (US)

(72) Inventors: Sagar Suthram, Portland, OR (US); Seung-June Choi, Portland, OR (US); Vishal Javvaji, Hillsboro, OR (US); Soumya Kar, Hillsboro, OR (US); Ahmed Esmail, Hillsboro, OR (US); Gokul Malyavanatham, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 941 days.

(21) Appl. No.: 16/147,112

(22) Filed: Sep. 28, 2018

(65) Prior Publication Data
US 2020/0105669 A1   Apr. 2, 2020

(51) Int. Cl.
| | | |
|---|---|---|
| H01L 23/522 | (2006.01) | |
| H01L 23/66 | (2006.01) | |
| H10D 1/47 | (2025.01) | |
| H10D 86/85 | (2025.01) | |

(52) U.S. Cl.
CPC ...... *H01L 23/5228* (2013.01); *H01L 23/5226* (2013.01); *H01L 23/66* (2013.01); *H10D 1/47* (2025.01); *H10D 86/85* (2025.01); *H01L 2223/6672* (2013.01)

(58) Field of Classification Search
CPC ................................................. H01L 23/5226
See application file for complete search history.

(56) References Cited

U.S. PATENT DOCUMENTS

| | | | | |
|---|---|---|---|---|
| 6,124,198 | A * | 9/2000 | Moslehi | H01L 23/5222 438/626 |
| 2006/0181388 | A1 * | 8/2006 | Chinthakindi | H01L 27/0629 338/309 |
| 2007/0040239 | A1 * | 2/2007 | Chinthakindi | H01L 23/5228 257/536 |
| 2009/0015369 | A1 * | 1/2009 | Takeda | H01L 28/20 338/307 |
| 2012/0146186 | A1 * | 6/2012 | Lukaitis | H01L 28/24 257/536 |
| 2015/0115410 | A1 * | 4/2015 | Tokumitsu | H01L 27/0802 257/536 |
| 2019/0304905 | A1 * | 10/2019 | Wee | H01L 27/0255 |

* cited by examiner

*Primary Examiner* — Kevin Parendo
(74) *Attorney, Agent, or Firm* — Schwabe, Williamson & Wyatt P.C.

(57) ABSTRACT

A semiconductor structure is disclosed. The semiconductor structure includes back end layers that include a first metallization layer, a second metallization layer, and a scalable resistor between the first metallization layer and the second metallization layer. The semiconductor structure also includes front end layers.

17 Claims, 7 Drawing Sheets

AND PROCESS FOR A PRECISION RESISTOR

TECHNICAL FIELD

Embodiments of the disclosure pertain to precision resistors and, in particular, to the design and fabrication of precision resistors.

BACKGROUND

High-speed analog and radio frequency (RF) designs for 10 nm technology nodes require precision resistors that satisfy certain minimum requirements for variation, mismatch, parasitic-cap, reliability, temperature-coefficient and flicker noise/thermal noise. The precision resistors also need to be compliant with standard design rules and integration friendly to enable robust design use. In a previous approach, precision resistors are designed using a design portal where design choices are limited to copies selected from templates. Such resistors are not scalable and do not meet many of the advanced 10 nm analog and RF design requirements. In other approaches a scalable precision resistor is provided that has location, process and design requirements that are incompatible with the location, process and design requirements of 10 nm technology. Because of the incompatibility of the location, process and design requirements of such approaches with those of 10 nm technology, they have proven unsatisfactory.

In some approaches the resistors are formed in the frontend of a semiconductor structure in a lower metal section. The lower metal section of 10 nm technology structures are critical to yield. Importantly, any process tweak involving the lower metal section that is made to improve yield directly impacts the resistor and thus can compromise resistor performance. In the same way, because the resistor is located in the lower metal section, any process tweak to enhance resistor performance metrics risks impacting baseline process yield.

DESCRIPTION OF THE EMBODIMENTS

A precision resistor is described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In some approaches precision resistors are formed in the frontend of semiconductor structures in a lower metal section. However, the lower metal section of 10 nm technology structures are very critical for yield. Any process tweak involving the lower metal section that is made to improve technology yield directly impacts the resistor and thus can compromise resistor performance. In the same way, because the resistor is located in the lower metal section, any process tweak to enhance resistor performance metrics risks impacting baseline process yield.

A method for forming a precision resistor that addresses the shortcomings of the previous approaches is disclosed. In an embodiment, a scalable precision resistor technology that integrates well with existing processes without adding significant yield risk while simultaneously meeting the analog/radio frequency (RF) design requirements for technologies that include but are not limited to 10 nm technology is provided. In an embodiment, a scalable thin film resistor (TFR) is formed between the M1 and M2 layers in the backend stack of the semiconductor structure that includes the TFR. In an embodiment, the layers up to M1 under the TFR are dummy layers. In an embodiment, using a design application and portal, based on design requirements, the user can pick the width (W)/length (L) dimensions of the TFR to optimize the trade-offs between the different performance metrics like parasitic-cap, reliability and target resistance.

Figure 1:
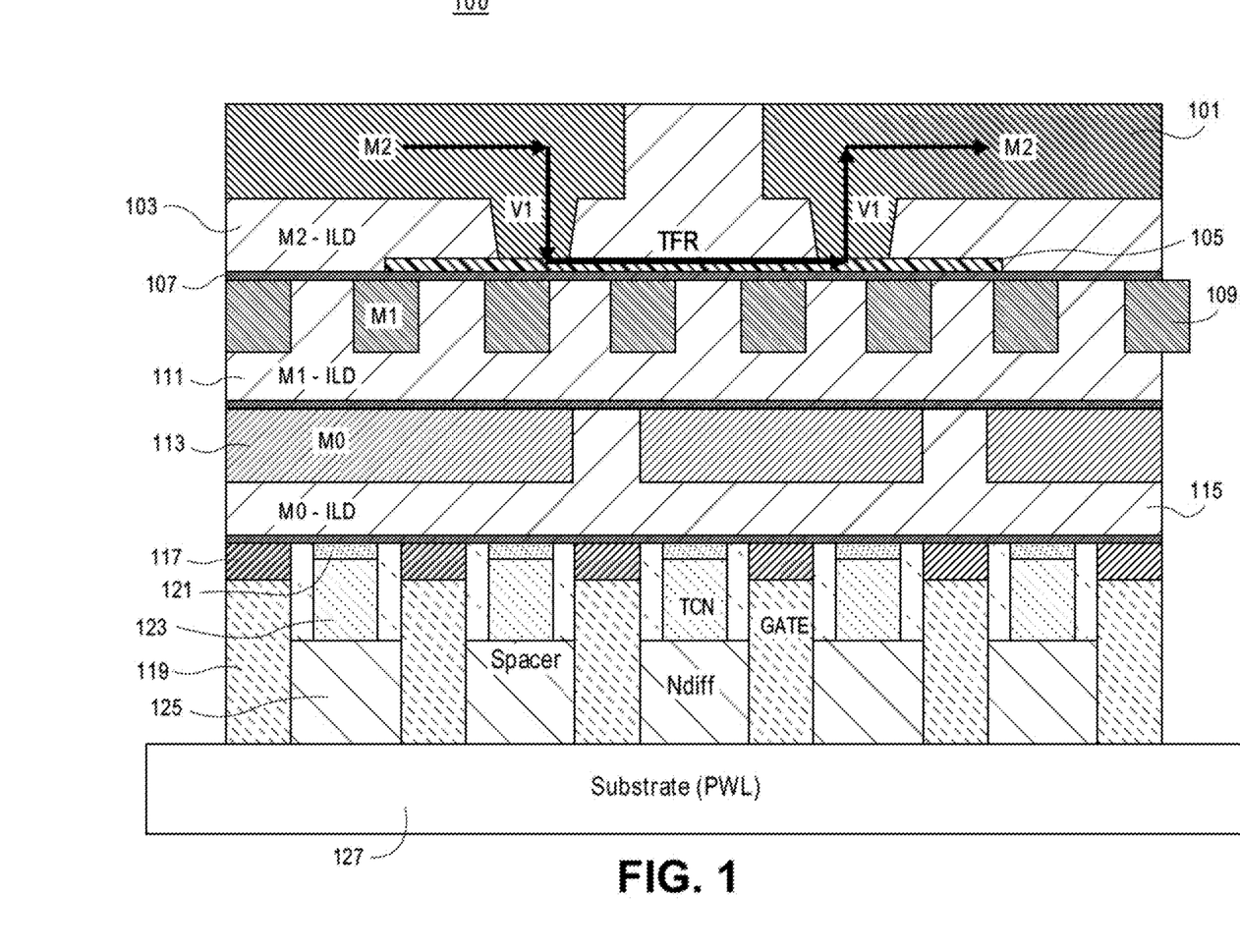
FIG. 1 is an illustration of a cross-section of a semiconductor structure that includes a precision resistor that is designed according to an embodiment.

FIG. 1 is an illustration of a cross-section of a semiconductor structure 100 according to an embodiment. FIG. 1 shows metallization layer 101, dielectric layer 103, thin film resistor (TFR) 105, etch stop layer 107, metallization layer 109, dielectric layer 111, metallization layer 113, dielectric 115, insulator 117, gate 119, insulator 121, trench contact (TCN) 123, spacer 125 and substrate 127.

Referring to FIG. 1, the gate structures 119 are formed above substrate 127. The spacers 125 are formed between the gate structures 119. The TCN 123 are formed above the spacers 125. The insulator 121 are formed above the TCN 123. The dielectric layer 115 is formed above the insulator 117 and the insulator 121. Metallization layer 113 is formed above the dielectric layer 115. The dielectric layer 111 is formed above the metallization layer 113. The metallization layer 109 is formed above and adjacent respective portions of dielectric layer 111. The thin film resistor 105 is formed above portions of the dielectric layer 111 and the metallization layer 109. The dielectric layer 103 covers surfaces of portions of the thin film resistor 105. The metallization layer 101 is formed above portions of dielectric layer 103 and extends through vias into the surface of the thin film resistor 105.

In an embodiment the metallization layer 101 can be formed from material that includes nickel or copper. In other embodiments, the metallization layer 101 can be formed from other materials. In an embodiment, the dielectric layer 103 can be formed from silicon oxide. In other embodiments, the dielectric layer 103 can be formed from other materials. In an embodiment, the thin film resistor 105 can be formed from titanium nitride. In other embodiments, the thin film resistor can be formed from other materials. In an embodiment, the etch stop layer 107 can be formed from silicon nitride. In other embodiments, the etch stop layer 107 can be formed from other materials. In an embodiment, the metallization layer 109 can be formed from material that includes nickel or copper. In other embodiments, the metallization layer 109 can be formed from other materials. In an embodiment, the dielectric layer 111 can be formed from silicon oxide. In other embodiments, the dielectric layer 111 can be formed from other materials. In an embodiment, metallization layer 113 can be formed from material that includes nickel or copper. In other embodiments, metallization layer 113 can be formed from other materials. In an embodiment, the dielectric 115 can be formed from silicon oxide. In other embodiments, the dielectric layer 115 can be formed from other materials. In an embodiment, the insulator 117 can be formed from silicon oxide or silicon nitride. In other embodiments, the insulator 117 can be formed from other materials. In an embodiment, the gate structures 119 can be formed from material that includes nickel or titanium. In other embodiments, the gate structures 119 can be formed from other materials. In an embodiment, the insulator 121 can be formed from silicon oxide or silicon nitride. In other embodiments, the insulator 121 can be formed from other materials. In an embodiment, the TCN 123 can be formed form nickel or copper. In other embodiments, the TCN 123 can be formed from other materials. In an embodiment, the spacer 125 can be formed from silicon dioxide or silicon nitride. In other embodiments, the spacer 125 can be formed from other materials. In an embodiment, the substrate 127 can be formed from silicon. In other embodiments, the substrate 127 can be formed from other materials.

In an embodiment, the scalable thin TFR 105 is formed between the M1 and the M2 layers in the backend of the semiconductor structure 100. In an embodiment, all the layers in the semiconductor structure 100 up to the M1 layer that lie underneath the TFR 105 are dummy layers. Based on the requirements of a particular design, a designer can select the width and length dimensions of the TFR 105 in order to maximize performance by taking into consideration performance trade-offs between performance metrics like parasitic-cap, reliability and target resistance associated with the selections. In an embodiment, an automated system that facilitates the design of precision resistors via a portal can be provided. The following table shows the scalability of the TFR dimensions that can be allowed for users according to an embodiment. In an embodiment, the performance metrics can scale with these features depending on a pre-defined equation. In an embodiment, the automation code associated with the automated design system generates layouts that are design rule clean.

TABLE 1

| Cell Width | TFR WIDTHS | Cell Lengths |
| --- | --- | --- |
| 8PP | 3-5PP | 48DG + N * 24DG |
| 12PP | 3-8PP | 48DG + N * 24DG |
| 16PP | 3-11PP | 48DG + N * 24DG |
| 20PP | 3-14PP | 48DG + N * 24DG |

Referring to Table 1, in an embodiment, the system allows cell widths of 8PP, 12PP, 16PP, and 20PP. In an embodiment, the system allows TFR widths of 3-5PP, 3-8PP, 3-11PP and 3-14PP. In an embodiment, the system allows a cell length of 48DG+N*24DG. It should be appreciated that the TFR dimensions of Table 1, are exemplary of an embodiment. In other embodiments other TFR dimensions can be used.

The TFR 105 fabrication process flow is designed to ensure that the vias in the first via layer V1 land on the TFR sheet above M1 without punching through the regions. Moreover, in an embodiment, in the regions of the semiconductor structure 100 backend without TFR, a default V1 process is used to connect M1 to M2.

In operation, in an embodiment, for high-speed analog and RF designs for 10 nm technology nodes (or other technology nodes), the precision TFR 105 satisfies minimum requirements that include but are not limited to variation, mismatch, parasitic-cap, reliability, temperature-coefficient, flicker noise and thermal noise. The precision TFR 105 is also standard design rule compliant and amenable to integration. This facilitates robust design use. Additionally, the scalable precision TFR 105 integrates into existing process stacks without adding significant yield risk while simultaneously meeting analog/RF design requirements.

Figure 2A:
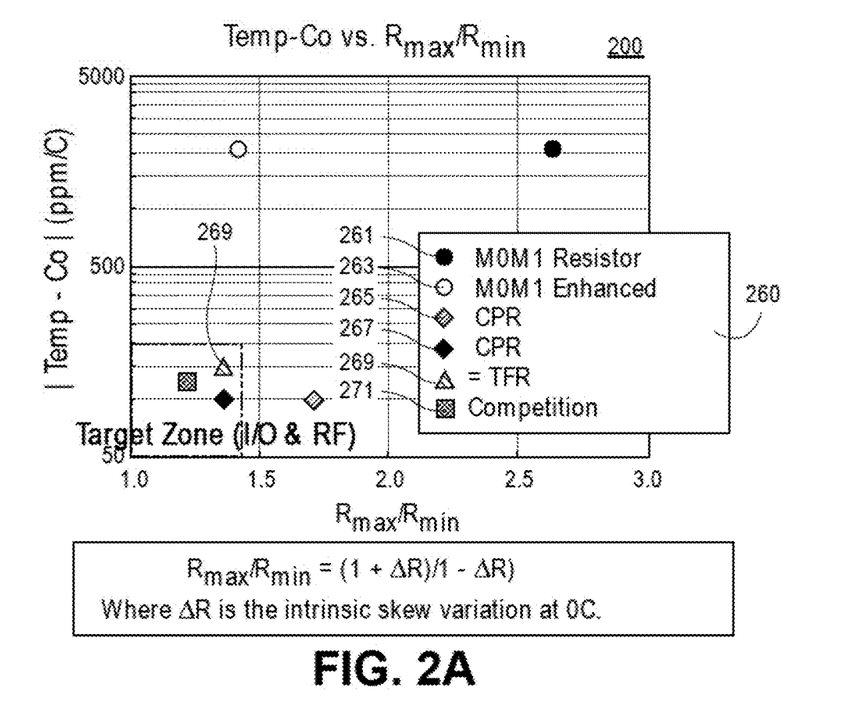
FIGS. 2A-2C show graphs of the performance of a precision resistor designed according to an embodiment, in addition to the performance of resistors designed according to previous approaches, with respect to respective performance metrics.
Figure 2B:
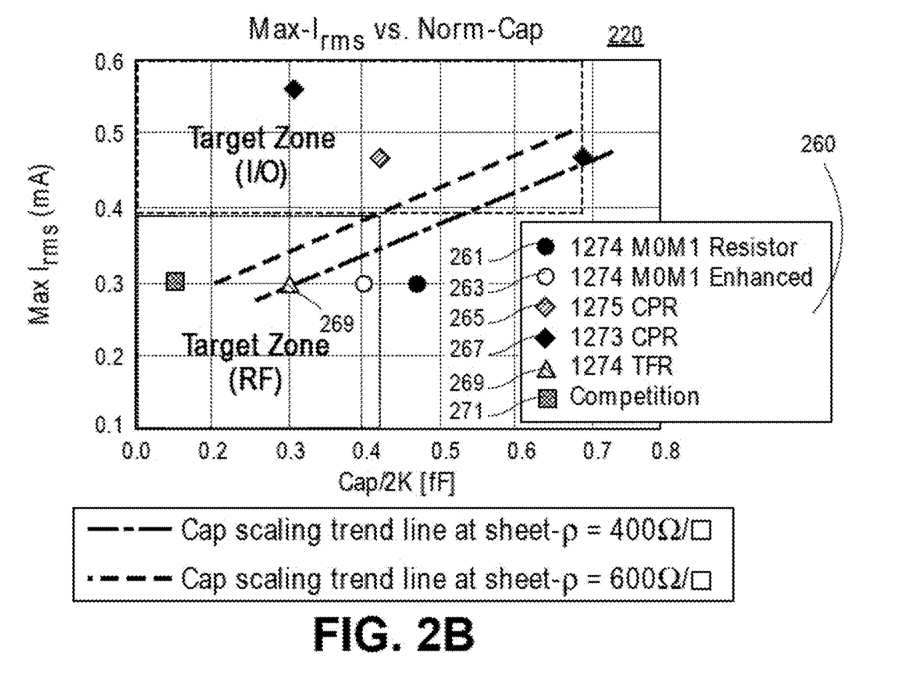
Figure 2C:
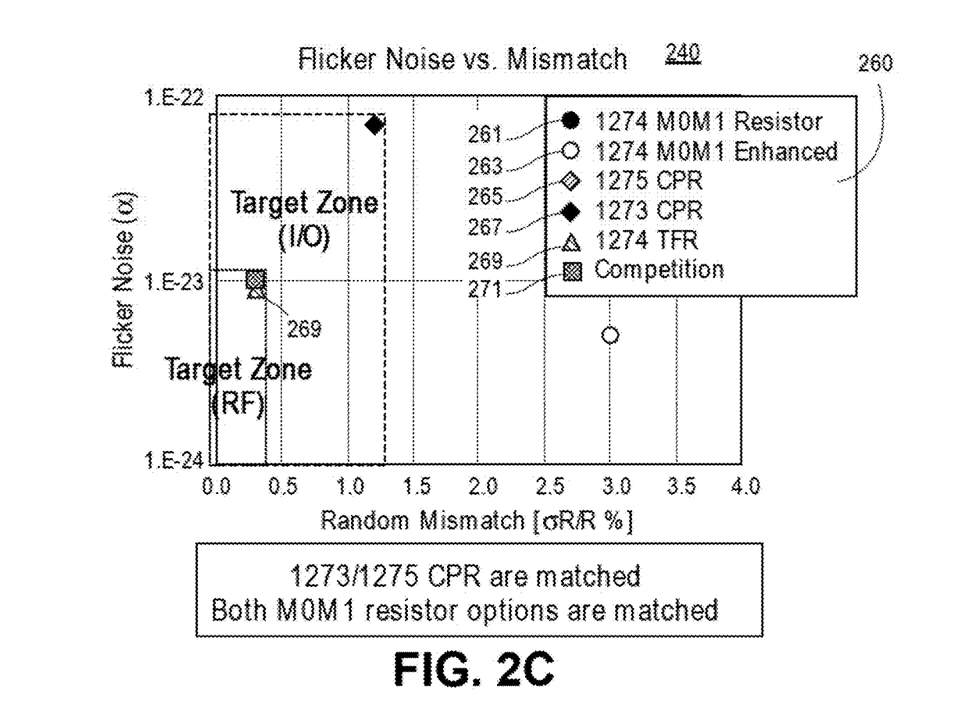

FIG. 2A-2C show graphs of the performance of an embodiment, and the performances of previous approaches, with respect to respective performance metrics. In particular, FIGS. 2A-2C includes plots that illustrate the performance of an embodiment, and the performance of previous approaches with respect to performance metric target zones for analog and RF designs. FIG. 2A is a graph 200 of temperature coefficient versus maximum resistance (Rmax)/minimum resistance (Rmin). FIG. 2B is a graph 220 of maximum current (Max-I) versus normal capacitance (Norm-Cap). FIG. 2C is a graph 240 of flicker noise versus mismatch. The legend 260 at right lists the resistors 261-271 whose plots are included.

Referring to FIGS. 2A-2C, the plot corresponding to the performance of the TFR 269 of an embodiment, is the only performance plot among those shown that lies within all of the target performance zones. This indicates that the TFR 269 meets the performance requirements for each of the metrics that are used to measure the performance of the resistors. In an embodiment, in addition to meeting or exceeding the performance of the other resistors, TFR 269 is scalable and thus offers a vast amount of design freedom.

As regards the CPR 265 and 267 and the M0M1 resistors 261 and 263, in addition to design disadvantages, their fabrication involves significant challenges as well. For example, such involves a placement of the resistor in the frontend/lower metal section of the 10 nm technology structure. This area of the structure greatly affects yield. In particular, any process tweaks aimed at improving technology yield that involves this area can compromise performance. Moreover, any tweaks to enhance resistor performance can compromise baseline process yield. In exemplary embodiments, this is obviated by the positioning of the resistor in the backend where yield is not affected. In addition, in exemplary embodiments, the design freedom that is provided obviates the need for tweaking for purposes of improving resistor performance metrics.

FIGS. 3A-3H are illustrations of cross-sections of a semiconductor structure 300 during fabrication according to an embodiment.

Figure 3A:
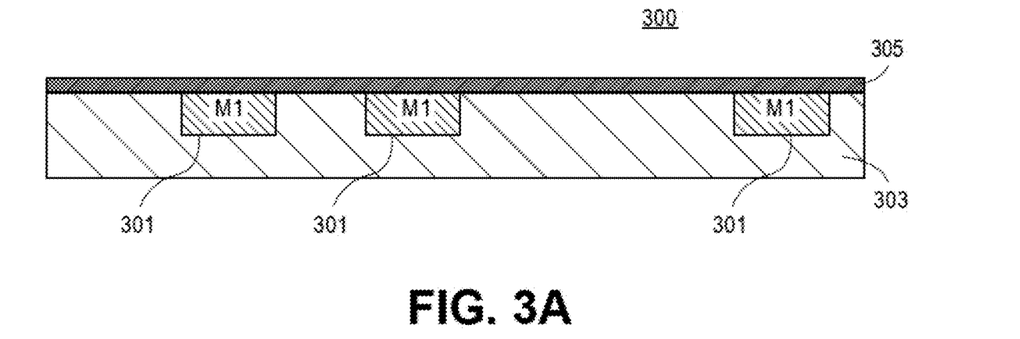
FIGS. 3A-3H are illustrations of cross-sections of a semiconductor structure that includes a precision resistor during the fabrication of the semiconductor structure according to an embodiment.

Referring to FIG. 3A, in one or more initial operations, metallization structures 301 are formed in interlayer dielectric 303, etch stop layer 305 is formed on the top surface of the interlayer dielectric 303 to cover metallization structures 301 in the backend portion of the semiconductor structure 300.

Figure 3B:
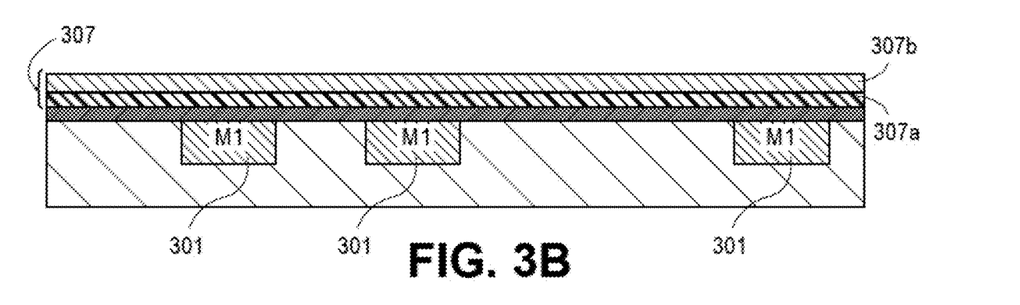

Referring to FIG. 3B, after one or more operations that result in the cross-section shown in FIG. 3A, a thin film resistor (TFR) stack 307 is formed above the etch stop layer 305. In an embodiment, the TFR stack 307 includes TFR liner 307a and TFR thin film 307b. In an embodiment, the TFR stack 307 can be formed by the blanket deposition of the TFR liner 307a and the TFR thin film 307b above the interlayer dielectric 303. In other embodiments, the TFR stack 307 can be formed in other suitable manners. In an embodiment, the TFR liner 307a can be formed from oxide. In other embodiments, the TFR liner 307a can be formed from other materials. In an embodiment, the TFR thin film 307b can be formed from titanium nitride. In other embodiments, the TFR thin film 307b can be formed from other materials.

Figure 3C:
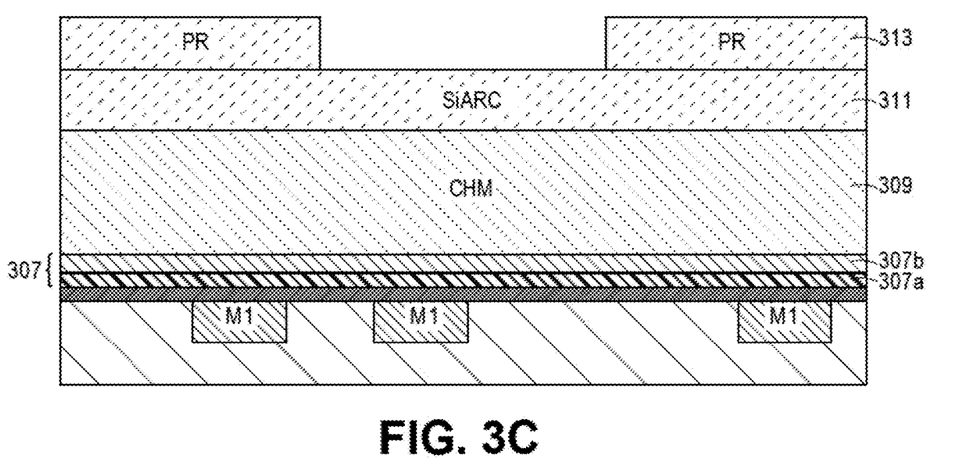

Referring to FIG. 3C, after one or more operations that result in the cross-section shown in FIG. 3B, CHM 309 and SiARC 311 layers are formed above the thin film stack 307, and photoresist 313 is formed on the top surface of the SiARC 311 and patterned (together these layers are referred to herein as the TFR "patterning" stack). In other embodiments, materials other than the CHM 309 and the SiARC 311 can be used. In an embodiment, the CHM 309 layer and the SiARC 311 layer are formed by a blanket deposition of CHM, SiARC and photoresist above the thin film resistor stack 307. After the TFR patterning stack has been formed above the TFR stack 307, the photoresist 313 is exposed and developed such that the desired TFR pattern is transferred from the photoresist 313 to the TFR stack 307. In other embodiments, the desired TFR pattern can be transferred to the TFR stack 307 in other manners.

Figure 3D:
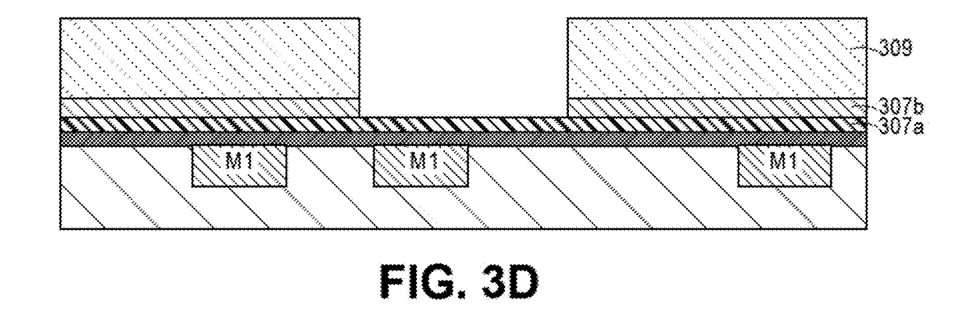

Referring to FIG. 3D, after one or more operations that result in the cross-section shown in FIG. 3C, an etch through the TFR patterning stack is performed. Specifically, an etch through the SiARC 311, the CHM 309, and the TFR thin film 307b that stops on the TFR liner 307a is performed. In an embodiment, a dry etch can be used to transfer the pattern from the photoresist 313 to the TFR stack 307. In other embodiments, the transfer of the pattern from the photoresist 313 to the TFR stack 307 can be done in other manners. In an embodiment, the portions of the CHM and the SiARC that are removed can be ashed away. In other embodiments, the portions of the CHM and the SiARC that are removed can be removed in other manners. Subsequently, in an embodiment, the exposed TFR liner 307a can be wet etched. In other embodiments, the exposed TFR liner 307a can be etched in other manners.

Figure 3E:
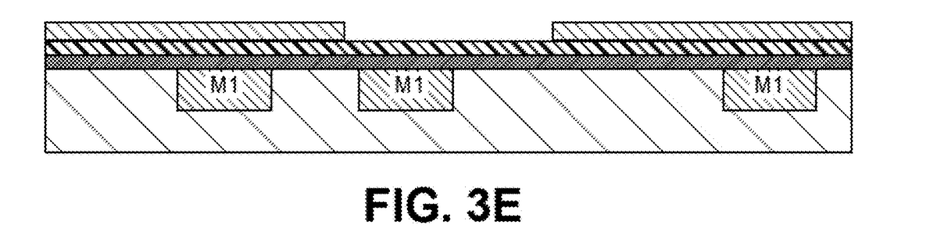

Referring to FIG. 3E, after one or more operations that result in the cross-section shown in FIG. 3D, remaining portions of the TFR patterning stack are removed. In an embodiment, the remaining portions of the TFR patterning stack is removed by an ash away process. In other embodiments, the TFR patterning stack that can be removed in other manners.

Figure 3F:
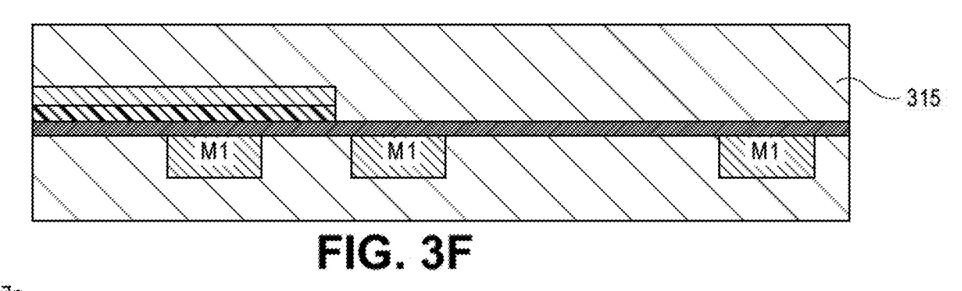

Referring to FIG. 3F, after one or more operations that result in the cross-section shown in FIG. 3E, an ILD 315 is formed above the TFR. In an embodiment, the ILD 315 is formed by deposition. In other embodiments, the ILD 315 can be formed in other manners.

Figure 3G:
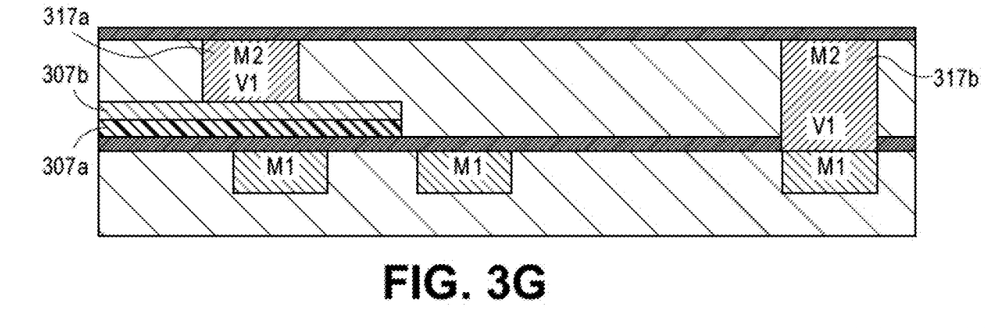

Referring to FIG. 3G, after one or more operations that result in the cross-section shown in FIG. 3F, vias are formed in the ILD 315 and filled with metal contacts 317a and 317b. In an embodiment, the metal contacts 317a and 317b are a part of a backend metal layer. In an embodiment, the metal is a part of a third metal layer. In an embodiment, the leftside metal contact 317a is formed to land on the surface of the TFR 307b. In other embodiments, the leftside metal contact 317a can be formed to land on the surface of the TFR liner 307a.

Figure 3H:
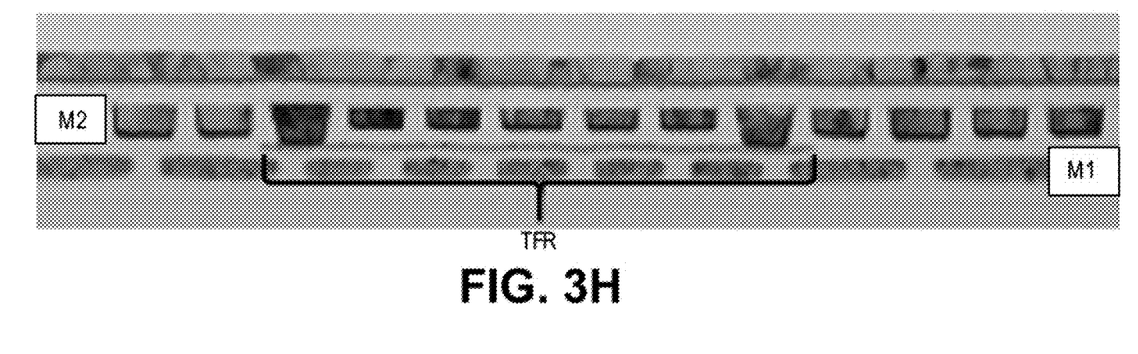

Referring to FIG. 3H, after one or more operations that result in the cross-section shown in FIG. 3G, the final TFR stack structure is formed.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 4:
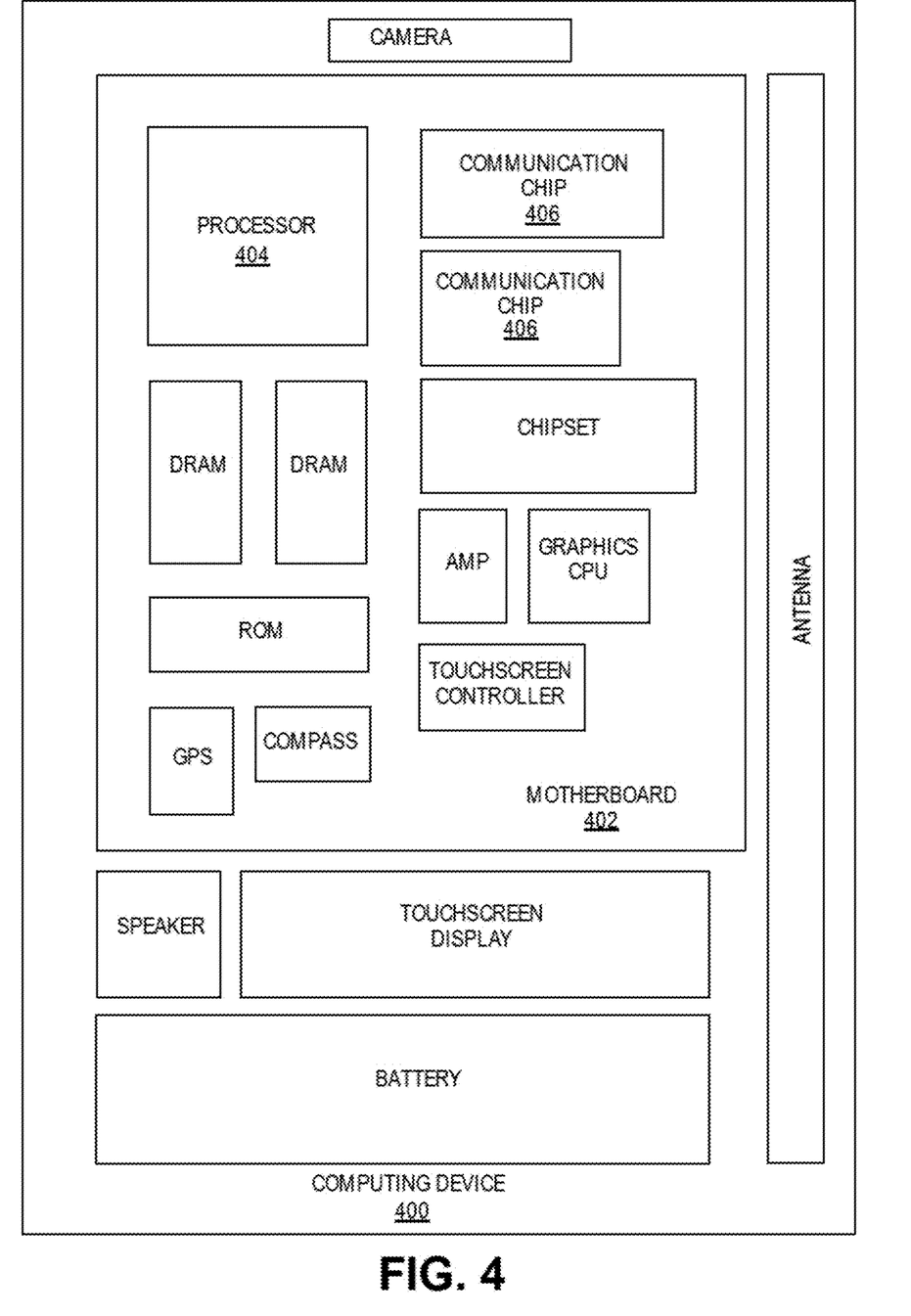
FIG. 4 illustrates a computing device in accordance with one implementation of an embodiment.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip includes one or more devices, such as MOS-FET transistors built in accordance with implementations of the invention.

In further implementations, another component housed within the computing device 400 may contain an integrated circuit die that includes one or more devices, such as MOS-FET transistors built in accordance with implementations of the invention.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Figure 5:
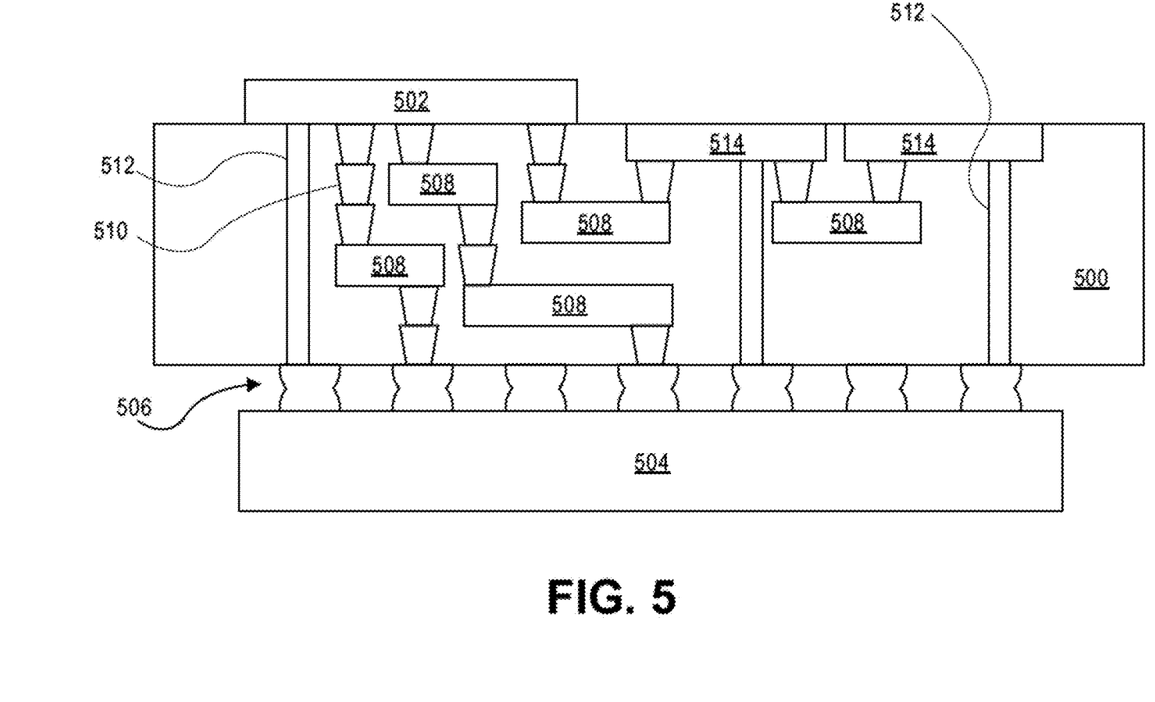
FIG. 5 illustrates an interposer that includes one or more implementations of an embodiment.

FIG. 5 illustrates an interposer 500 that includes one or more embodiments of the invention. The interposer 500 is an intervening substrate used to bridge a first substrate 502 to a second substrate 504. The first substrate 502 may be, for instance, an integrated circuit die. The second substrate 504 may be, for instance, a memory module, a computer motherboard, or another integrated circuit die. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500. In accordance with embodiments of the invention, apparatuses or processes disclosed herein may be used in the fabrication of interposer 500.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example Embodiment 1

A semiconductor structure includes back end layers that includes a first metallization layer, a second metallization layer; and a scalable resistor between the first metallization layer and the second metallization layer, and front end layers.

Example Embodiment 2

The semiconductor structure of example embodiment 1, wherein the first metallization layer is the topmost metallization layer in the semiconductor structure.

Example Embodiment 3

The semiconductor structure of example embodiment 1, wherein the first metallization layer contacts the thin film resistor.

Example Embodiment 4

The semiconductor structure of example embodiment 1, wherein the first metallization layer includes a plurality of contacts to the thin film resistor.

Example Embodiment 5

The semiconductor structure of example embodiment 4, wherein the plurality of contacts to the thin film resistor extend into the surface of the thin film resistor.

Example Embodiment 6

The semiconductor structure of example embodiment 4, wherein the plurality of contacts to the thin film resistor extend through vias in an interlayer dielectric that is above the thin film resistor.

Example Embodiment 7

The semiconductor structure of example embodiment 6, wherein the plurality of contacts to the thin film resistor are separated by one or more parts of the insulator film.

Example Embodiment 8

A semiconductor structure, comprising: back end layers, including: a first metallization layer; a second metallization layer; and a scalable resistor between the first metallization layer and the second metallization layer, and front end layers, including: a substrate; gate structures formed above the substrate; an insulator layer above the gate structures; and a metallization layer above the insulator layer.

Example Embodiment 9

The semiconductor structure of example embodiment 8, wherein the first metallization layer is the topmost metallization layer in the semiconductor structure.

Example Embodiment 10

The semiconductor structure of example embodiment 8, wherein the thin film resistor is contacted by the first metallization layer.

Example Embodiment 11

The semiconductor structure of example embodiment 8, wherein the first metallization layer includes a plurality of contacts to the thin film resistor.

Example Embodiment 12

The semiconductor structure of example embodiment 11, wherein the plurality of contacts to the thin film resistor extend into the surface of the thin film resistor.

Example Embodiment 13

The semiconductor structure of example embodiment 11, wherein the plurality of contacts to the thin film resistor extend through vias in an interlayer dielectric that is above the thin film resistor.

Example Embodiment 14

The semiconductor structure of example embodiment 13, wherein the plurality of contacts to the thin film resistor are separated by one or more parts of the insulator film.

Example Embodiment 15

A method, comprising: forming back end layers, including: forming a first metallization layer; forming a second metallization layer; and forming a scalable resistor between the first metallization layer and the second metallization layer, and forming front end layers.

Example Embodiment 16

The method of example embodiment 15, wherein the first metallization layer is the topmost metallization layer in the semiconductor structure.

Example Embodiment 17

The method of example embodiment 15, wherein the thin film resistor is contacted by the first metallization layer.

Example Embodiment 18

The method of example embodiment 15, wherein the first metallization layer includes a plurality of contacts to the thin film resistor.

Example Embodiment 19

The method of example embodiment 18, wherein the plurality of contacts to the thin film resistor extend into the surface of the thin film resistor.

Example Embodiment 20

The method of example embodiment 18, wherein the plurality of contacts to the thin film resistor extend through vias in an interlayer dielectric that is above the thin film resistor.

What is claimed is:

1. A semiconductor structure, comprising:
    back end layers, including:
        a first metallization layer in a first dielectric layer;
        a second metallization layer;
        an etch stop layer over the first metallization layer and the first dielectric layer; and
        a thin film resistor over the etch stop layer and between the first metallization layer and the second metallization layer, wherein the second metallization layer includes a plurality of contacts to the thin film resistor and a conductive line over and coupled to one of the plurality of contacts, the conductive line extending laterally beyond the thin film resistor, wherein the plurality of contacts is on the thin film resistor but does not extend entirely through the thin film resistor, and wherein the thin film resistor vertically overlaps and extends laterally beyond outermost laterally opposite sidewalls of an uppermost portion of a metal interconnect of the first metallization layer immediately below the thin film resistor; and
    front end layers, the front end layers comprising a plurality of gate structures, wherein the thin film resistor is vertically overlapping with the plurality of gate structures.

2. The semiconductor structure of claim 1, wherein the second metallization layer is the topmost metallization layer in the semiconductor structure.

3. The semiconductor structure of claim 1, wherein the second metallization layer contacts the thin film resistor.

4. The semiconductor structure of claim 1, wherein the plurality of contacts to the thin film resistor extend into the surface of the thin film resistor.

5. The semiconductor structure of claim 1, wherein the plurality of contacts to the thin film resistor extend through vias in an interlayer dielectric that is above the thin film resistor.

6. The semiconductor structure of claim 5, wherein the plurality of contacts to the thin film resistor are separated by one or more parts of the insulator film.

7. A semiconductor structure, comprising:
    back end layers, including:
        a first metallization layer in a first dielectric layer;
        a second metallization layer;
        an etch stop layer over the first metallization layer and the first dielectric layer; and
        a thin film resistor over the etch stop layer and between the first metallization layer and the second metallization layer, wherein the second metallization layer includes a plurality of contacts to the thin film resistor and a conductive line over and coupled to one of the plurality of contacts, the conductive line extending laterally beyond the thin film resistor, wherein the plurality of contacts is on the thin film resistor but does not extend entirely through the thin film resistor, and wherein the thin film resistor vertically overlaps and extends laterally beyond outermost laterally opposite sidewalls of an uppermost portion of a metal interconnect of the first metallization layer immediately below the thin film resistor; and front end layers, including:
- a substrate;
- a plurality of gate structures above the substrate, wherein the thin film resistor is vertically overlapping with the plurality of gate structures;
- an insulator layer above the gate structures; and
- a metallization layer above the insulator layer.

8. The semiconductor structure of claim 7, wherein the second metallization layer is the topmost metallization layer in the semiconductor structure.

9. The semiconductor structure of claim 7, wherein the thin film resistor is contacted by the second metallization layer.

10. The semiconductor structure of claim 7, wherein the plurality of contacts to the thin film resistor extend into the surface of the thin film resistor.

11. The semiconductor structure of claim 7, wherein the plurality of contacts to the thin film resistor extend through vias in an interlayer dielectric that is above the thin film resistor.

12. The semiconductor structure of claim 11, wherein the plurality of contacts to the thin film resistor are separated by one or more parts of the insulator film.

13. A method, comprising:
   forming back end layers, including:
      forming a first metallization layer in a first dielectric layer;
      forming a second metallization layer;
      forming an etch stop layer over the first metallization layer and the first dielectric layer; and
      forming a thin film resistor over the etch stop layer and between the first metallization layer and the second metallization layer, wherein the second metallization layer includes a plurality of contacts to the thin film resistor and a conductive line over and coupled to one of the plurality of contacts, the conductive line extending laterally beyond the thin film resistor, wherein the plurality of contacts is on the thin film resistor but does not extend entirely through the thin film resistor, and wherein the thin film resistor vertically overlaps and extends laterally beyond outermost laterally opposite sidewalls of an uppermost portion of a metal interconnect of the first metallization layer immediately below the thin film resistor; and forming front end layers, the front end layers comprising a plurality of gate structures, wherein the thin film resistor is vertically overlapping with the plurality of gate structures.

14. The method of claim 13, wherein the second metallization layer is the topmost metallization layer in the semiconductor structure.

15. The method of claim 13, wherein the thin film resistor is contacted by the second metallization layer.

16. The method of claim 13, wherein the plurality of contacts to the thin film resistor extend into the surface of the thin film resistor.

17. The method of claim 13, wherein the plurality of contacts to the thin film resistor extend through vias in an interlayer dielectric that is above the thin film resistor.

* * * * *